United States Patent
Kim et al.

(10) Patent No.: US 9,383,639 B2
(45) Date of Patent: Jul. 5, 2016

(54) MASK

(71) Applicants: BOE TECHNOLOGY GROUP CO., LTD, Beijing (CN); BEIJING BOE DISPLAY TECHNOLOGY CO., LTD, Beijing (CN)

(72) Inventors: Kiyong Kim, Beijing (CN); Zengbiao Sun, Beijing (CN); Tao Wang, Beijing (CN); Chaoqin Xu, Beijing (CN)

(73) Assignees: BOE Technology Group Co., Ltd., Beijing (CN); Beijing BOE Display Technology Co., Ltd., Beijing (CN)

( * ) Notice: Subject to any disclaimer, the term of this patent is extended or adjusted under 35 U.S.C. 154(b) by 153 days.

(21) Appl. No.: 14/446,633

(22) Filed: Jul. 30, 2014

(65) Prior Publication Data
US 2015/0293440 A1    Oct. 15, 2015

(30) Foreign Application Priority Data
Apr. 11, 2014    (CN) .......................... 2014 1 0145265

(51) Int. Cl.
*G03F 1/38*    (2012.01)
*G03F 1/40*    (2012.01)

(52) U.S. Cl.
CPC .......................................... *G03F 1/38* (2013.01)

(58) Field of Classification Search
CPC .................................... G03F 1/38; G03F 1/40
USPC ............................................................ 430/5
See application file for complete search history.

(56) References Cited

U.S. PATENT DOCUMENTS

2010/0203432 A1*    8/2010    Itoh ........................ B82Y 10/00
                                                              430/5

* cited by examiner

*Primary Examiner* — Stephen Rosasco
(74) *Attorney, Agent, or Firm* — Westman, Champlin & Koehler, P.A.

(57) ABSTRACT

An embodiment of the present invention discloses a mask. The mask comprises: a substrate; a light transmission area on the substrate; a light shielding area on the substrate, provided with at least two light shielding layers, each of the at least two light shielding layers having a preset mask pattern and being conductive; and one or more connecting wire(s), configured to respectively electrically connect the at least two light shielding layers.

14 Claims, 3 Drawing Sheets

MASK

CROSS-REFERENCE TO RELATED APPLICATION

This application claims the benefit of Chinese Patent Application No. 201410145265.0 filed on Apr. 11, 2014 in the State Intellectual Property Office of China, the whole disclosure of which is incorporated herein by reference.

BACKGROUND OF THE INVENTION

1. Field of the Invention

The present disclosure relates to a technical field of display, more particularly, to a mask.

2. Description of the Related Art

In a technical field of display, a mask is served as a very important patterning tool in semiconductor display industry. The mask is used to transfer a mask pattern on the mask onto a target substrate in a ratio of 1:1, so that conductive patterns or slit patterns are formed onto the target substrate.

The mask includes a light shielding area and a light transmission area, and the light shielding area is provided with a plurality of light shielding layers in different regions for shielding lights. Typically, the light shielding layer is a conductive layer having a relatively good etching property, but it tends to accumulate electrical charges, thereby generating an undesirable phenomenon of electro-static discharge (abbreviated, ESD).

Reasons for electrical charges being accumulated onto the mask mainly include the following aspects: during carrying or cleaning the mask or the like, it is easy for the electrical charges to accumulate onto the mask due to frictional effects, thereby forming the static electricity. It would cause the undesirable phenomenon of ESD once the electrostatic charges are accumulated up to a certain quantity. Release of the electrostatic charges will breakdown the light shielding layer on the mask, and the preset mask pattern corresponding to the light shielding layer would be damaged. Once such mask goes into production, it would cause enormous economic loss.

In a process of manufacturing products in practice, or in a process of exposing with the mask, it is inevitable that foreign matters will fall onto the mask. In order to avoid defects that the foreign matters on the mask cause bad reproducibility of the products, it is common to clean the mask with clean dry air (abbreviated, CDA). During the cleaning operation of the mask, CDA gas flow will bring friction with the light shielding layer on the mask, thereby generating a certain quantity of electrostatic charges on the light shielding layer. Since the substrate is typically made of insulative glass, the electrostatic charges on the light shielding layer cannot be released in time by means of the substrate. Once the electrostatic charges are built up to a certain extent, the electrostatic charges will be conducted on the conductive light shielding layers, thereby ESD will be generated where the charges are accumulated to the certain extent. In this way, the pattern of the mask is damaged, thus resulting in the gigantic economic loss.

In addition, upon manually carrying the mask, it is also easy to accumulate charges on the mask due to the contact friction and generate electrostatic charges. Thus, the undesirable phenomenon of ESD would take place.

As shown in FIG. 1, the main structure of the mask includes a light transmittive substrate 1, and a light transmission area and a light shielding area on the substrate 1. The light shielding area is provided with at least two conductive light shielding layers having preset mask patterns. One example of the mask pattern of the light shielding area is shown as in FIG. 1. The light shielding area includes a first light shielding layer 11, a second light shielding layer 12, a third light shielding layer 13, a fourth light shielding layer 14, a fifth light shielding layer 15 and a sixth light shielding layer 16. Respective light shielding layers are separated from each other and insulated from each other. The first light shielding layer 11 is in a comb-like form, while the remaining light shielding layers are in a strip-like form respectively. The second to sixth light shielding layers 12-16 are spaced apart by the comb-like parts in the first light shielding layer 11. As shown by the area marked by the dash line in FIG. 1, the comb-like parts within the area marked by the dash line are relatively dense, and thus a relatively large number of charges are easy to accumulate here. The charges on the first to sixth light shielding layers 11-16 cannot be released rapidly, and thus may be accumulated onto some light shielding layer. Therefore, it is easy to generate the ESD phenomenon. During the release of the electrostatic charges, relatively larger current would breakdown the light shielding layer, and damage the mask pattern of the light shielding layer.

SUMMARY OF THE INVENTION

In order to eliminate the above or other technical problems in the prior art, the present invention provides a mask, which has a novel structure, thereby avoiding the problem that the mask pattern would be damaged due to the release of electrostatic charges on the mask.

In accordance with one aspect of the invention, it provides a mask, comprising:
  a substrate;
  a light transmission area on the substrate;
  a light shielding area on the substrate, provided with at least two light shielding layers, each of the at least two light shielding layers having a preset mask pattern and being conductive; and
  one or more connecting wire(s), configured to electrically connect the at least two light shielding layers, respectively.

BRIEF DESCRIPTION OF THE DRAWINGS

The above and other features of the present invention will become more apparent by describing in detail exemplary embodiments thereof with reference to the accompanying drawings, in which.

DETAILED DESCRIPTION OF PREFERRED EMBODIMENTS OF THE INVENTION

Figure 1:
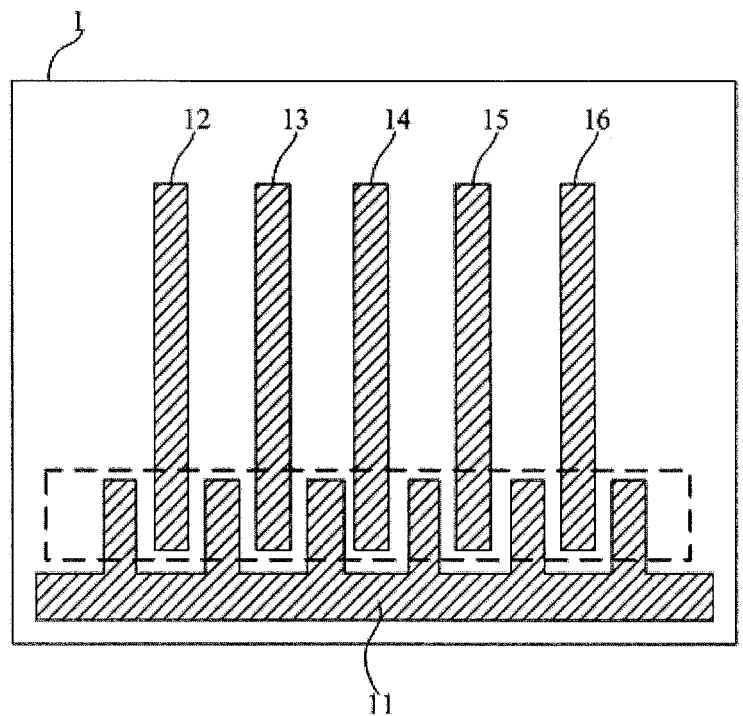
FIG. 1 is a schematic top view of a mask in the prior art.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

An embodiment of the present invention provides a mask with a novel structure, thereby avoiding the problem that the mask pattern of the mask would be damaged due to the release of the electrostatic charges on the mask.

It should be noted that electrostatic charges exist everywhere, and interaction (such as, friction, contact, induction, or conduction) between substances will cause the substance to get or lost electrons so that the substance loses its electrical balance and is charged. The build-up of the charges will impart the substance with the electrostatic charges. When the charges are accumulated sufficiently, the charges will be released, thus resulting in the breakdown of the surrounding substance, and reaching a new electrical balance. The release of the charges is also called as ESD phenomenon. Alternatively, two layers of the substance having larger electrical potential difference also can cause the accumulation of the charges, thus generating the ESD phenomenon. Such quick charge neutralization of the electrostatic charges is called as electrostatic discharge. Because the discharging rate thereof is very high and typically the resistance is very small, it is often to generate large instantaneous current. Such large current would damage the surrounding substance.

In order to solve the problem that the build-up of the electrostatic charges on the mask results in the release thereof, the embodiments of the present invention provide masks with novel structures. In the first embodiment of the present invention, the mask includes a substrate on which a light transmission area and a light shielding area are provided. The light shielding area is provided with at least two light shielding layers which have preset mask patterns and are conductive. The mask further includes one or more connection wire(s), for electrically connecting the at least two light shielding layers respectively. The connection wire has a width of 0.3-1.5 µm. The connection wire can connect the light shielding layers to form an isopotential body. It would not generate the release of the electrostatic charges due to the potential difference, at least between the light shielding layers connected by the connection wire(s). Meanwhile, when there are a relatively large amount of charges around the isopotential body, they are dispersed onto the isopotential body. Since the isopotential body has a surface area much larger than that of the light shielding layers before being connected together by the connecting wire(s), the charges are rapidly and evenly dispersed onto the isopotential body, thus preventing the happening of the ESD phenomenon. It is possible to prevent the breakdown of the mask pattern (the light shielding layer) on the mask, which is caused by the large current during the release of ESD, when the ESD phenomenon is generated on the mask. This would cause the damage to the mask pattern, even the rejection of the mask.

In addition, the width d of the connecting wire is in a range of 0.3~1.5 µm. When exposing the target substrate with the mask, the largest resolution f of the existing exposing machine is not less than 3 µm. When the conductive wire on the mask has a width of d<f/2, the exposing machine will not be able to recognize the conductive wire. Therefore, the connecting wire on the substrate cannot be recognized by the exposing machine, and the pattern of the connecting wire would not be formed on the target substrate, without any influence to the pattern to be formed on the target substrate. That is, the problem that the mask pattern of the mask is damaged due to the electrostatic breakdown caused by the release of the electrostatic charges is solved, without affecting the pattern on the target substrate after exposure.

The mask of the present invention as described above is adapted to the structures of any mask for exposure, i.e., the mask pattern on the mask is not limited herein.

The mask provided in accordance with the first embodiment of the present invention is described in detail below in conjunction with the accompanying figures, taking the specific mask pattern as an example.

Figure 2:
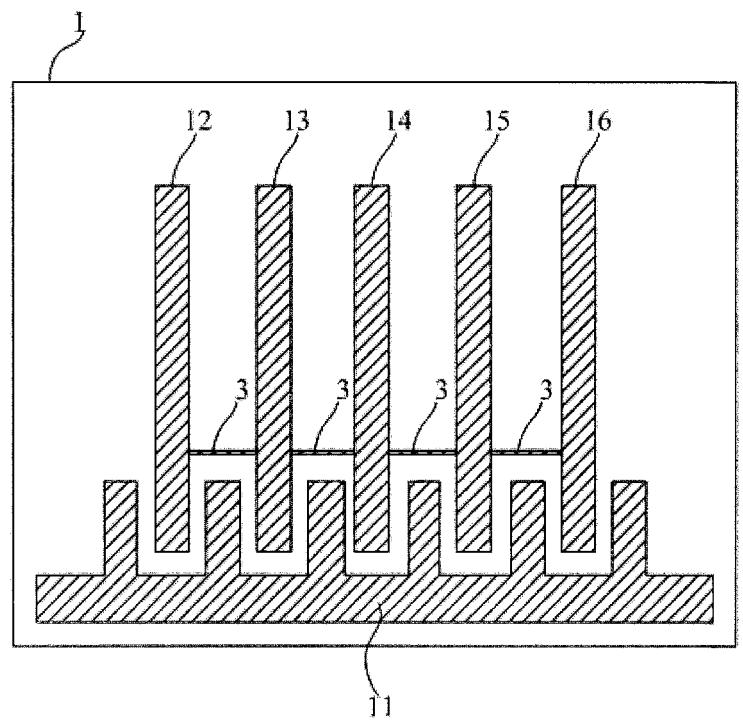
FIG. 2 is a schematic top view of a mask in accordance with a first embodiment of the present invention.

With reference to FIG. 2, the mask provided in accordance with the first embodiment of the present invention includes:

a substrate 1;

a light transmission area and a light shielding area on the substrate 1, wherein the light shielding area is provided with a first light shielding layer 11, a second light shielding layer 12, a third light shielding layer 13, a fourth light shielding layer 14, a fifth light shielding layer 15 and a sixth light shielding layer 16 separated from each other;

four connecting wires 3 located between any adjacent two layers of the second to sixth light shielding layers 12-16, wherein the first to sixth light shielding layers are connected in series, and the connecting wire 3 has a width of 0.3~1.5 µm.

As shown in FIG. 2, the first to sixth light shielding layers 11, 12, 13, 14, 15 and 16 are electrically insulated from each other, and the pattern corresponding to the areas where the six light shielding layers 11, 12, 13, 14, 15 and 16 are located, is complementary to the pattern corresponding to the light transmission area.

The first light shielding layer 11 is in a comb-like form, while the remaining light shielding layers 12-16 are in a strip-like form respectively. The second to sixth light shielding layers 12-16 are spaced apart by the comb-like parts in the first light shielding layer 11.

Firstly, the width of the connecting wire is in a range of 0.3~1.5 µm. The resolution f of the existing exposing machine is not less than 3 µm. When the conductive wire 3 on the mask has a width of d<f/2, the connecting wire on the substrate cannot be recognized by the exposing machine, and the pattern of the connecting wire would not be formed on the target substrate of the product. The relatively larger amount of electrostatic charges generated onto the substrate of the mask are evenly dispersed onto the isopotential body having a larger surface area. In this way, the amount of the electrostatic charges within each unit area is less, without the possibility to result in the breakdown of electrostatic charges. The completeness of the mask pattern on the mask can be ensured, without being damaged.

In the present disclosure, the connecting wire is provided between the light shielding layers on the substrate, and used to prevent the breakdown of the electrostatic charges. It can thoroughly and effectively eliminate the possibility that the breakdown of the electrostatic charges is caused by the operator not wearing electrostatic prevention ring or the cleaning of the mask via the CDA gas. In other words, with the mask provided in accordance with the first embodiment of the present invention, the operator does not need to wear the electrostatic prevention ring, and to clean the mask with the deionized wind gun, but it can easily disperse the electrostatic charges on the mask, thereby avoiding the problem that the breakdown of the electrostatic charges is caused by any friction or inequality of the electrical potential.

The mask as shown in FIG. 2 is only taken as one example. The connecting wire provided by an embodiment of the present invention can connect the first light shielding layer 11 to at least one of the second to sixth light shielding layers 12, 13, 14, 15 and 16 as required, for example by means of the connecting wire 3 as shown in FIG. 2. Alternatively, it is possible to connect the first light shielding layer 11 to at least two of the second to sixth light shielding layers 12, 13, 14, 15 and 16 by means of the connecting wire 3. This is not limiting to such case herein. In other words, the person skilled in the art can select the number of the light shielding layer to be connected by the connecting wire 3 and the number of the used connecting wire 3.

The mask pattern corresponding to the light shielding layers as described above is not limited herein, for example, the mask pattern corresponding to a peripheral circuit at a peripheral area on the substrate for the display, or the mask pattern corresponding to relatively complex electrode structures of the display area (AA area), and the like. The peripheral circuit can include conductive lead wires such as gate lead wires, data lead wires, common electrode lead wires. The electrode structure of the display area can include a slit electrode, and the like. The mask including the above described mask pattern is easy to generate the electrostatic charges, because there are more conductive lead wires, the wiring space is too limited. In particular, with respect to the display panel with higher pixels and a smaller size, the number of the conductive lead wires is very large, the arranging space is too limited, the spacing between the conductive lead wires is smaller, and it is very easy to accumulate the charges between the conductive lead wires and is difficult to release them in time, thereby resulting in the breakdown phenomenon of the static electricity.

The principles of generating the electrostatic charge release on the common mask are discussed herein below in conjunction with the related theory.

In the practical application, once electricity energy W of the electrostatic charges at some area on the mask arrives at a certain value, the release of the electrostatic charge will be generated.

The electrical energy W meets the following two equations (1-1) and (1-2):

$$W = \frac{1}{2}CU^2 \quad (1\text{-}1)$$

$$C = \varepsilon * \frac{S}{d} \quad (1\text{-}2)$$

W is the electrical energy stored by a capacitor, C is an electric capacity between two light shielding layers, U is an electrical potential difference between two adjacent light shielding layers, $\in$ is a dielectric constant of a medium (the light shielding layer), d is a distance between the capacitor substrates, and S is a facing area between the capacitor substrates.

It can be known from the equation (1-1) that, in the case of the largest storage energy W being equal, the less the capacitance becomes, the higher the voltage endurance capability (breakdown resistance capability) becomes. It can be known from the equation (1-2) that the voltage endurance capability can be improved by reducing the capacitance. The reduction of the capacitance can be achieved by decreasing S or increasing d in design.

However, as for high-end products, it is possible that the parameter S has been designed to be very large or the parameter d has been designed to be very small. The requirement for the product itself restricts the pattern design of the mask itself to be unchangeable. When the capacitance C is kept to be unchanged, it is only possible to decrease the electrical potential difference U between two mediums.

In the embodiments of the present invention, the purpose of decreasing or eliminating the electrical potential difference U can be achieved by the charge transfer. The isopotential field is formed by means of the charge transfer, so that the isopotential body can be formed between different light shielding layers. The electrical potential onto the isopotential body is equal everywhere, and the electrical potential difference between different light shielding layers on the isopotential body is zero. The capacitor storage energy is zero, and the local storage electrical quantity is zero either. Therefore, the breakdown discharge caused by too large electrical potential difference is avoided.

Preferably, the connecting wire has a width in a range of 0.5~1 μm.

More preferably, the connecting wire has a width of 0.8 μm.

The connecting wire having the width in a range of 0.5~1 μm can be manufactured by a method of using laser to pattern and manufacture the mask, which has a higher accuracy. Therefore, it is easy to pattern the pattern structure having the line width approximately in a range of 0.5~1 μm.

On basis of the mask provided by any example as described above, the connecting wire is located into the same layer as the light shielding layer and is made by the same material as the light shielding layer. In this way, it can ensure that the connecting wires and the respective light shielding layer can be produced by one same patterning process. As compared with the manufacturing process of the pattern mask on the mask in the prior art, it is not necessary to add any process. That is, the light shielding layers and the connecting wire can be manufactured by the patterning of the laser once time.

Typically, the light shielding layers having the preset mask pattern on the mask can be formed by conductive layers which are capable of shielding lights. The conductive layer has very strong etching capability.

Preferably, the light shielding layer is a chromium metal layer. The chromium metal layer has relatively good light shielding and etching properties, thus the mask has good property.

It should be noted that it is impossible to eliminate the electrostatic charges in time once it is generated on the glass substrate, and thus the charges are dispersed onto the metal conductor chromium pattern. Since the design requirement demands the metal chromium pattern including a plurality of pattern structures separated from each other, the electrical potential difference will be formed between two metal chromium patterns, and the ESD will occur once the electrical potential difference reaches a certain value (there is a relatively high electrical potential difference U, where there is a relatively large electric field intensity, and the distance d between two metal chromium patterns is smaller. It is easy for ESD to occur at the end of the chromium pattern, and the end of the pattern has a relatively large curvature as well as relatively large electric field intensity). The connecting wire with the width of less than 1.5 μm is present where the ESD is easy to happen, so that the independent metal chromium patterns everywhere are connected in series. In this way, it is impossible to form too large electrical potential difference by the accumulating of the electrostatic charges, thus the problem of ESD of the mask is thoroughly solved.

Figure 3:
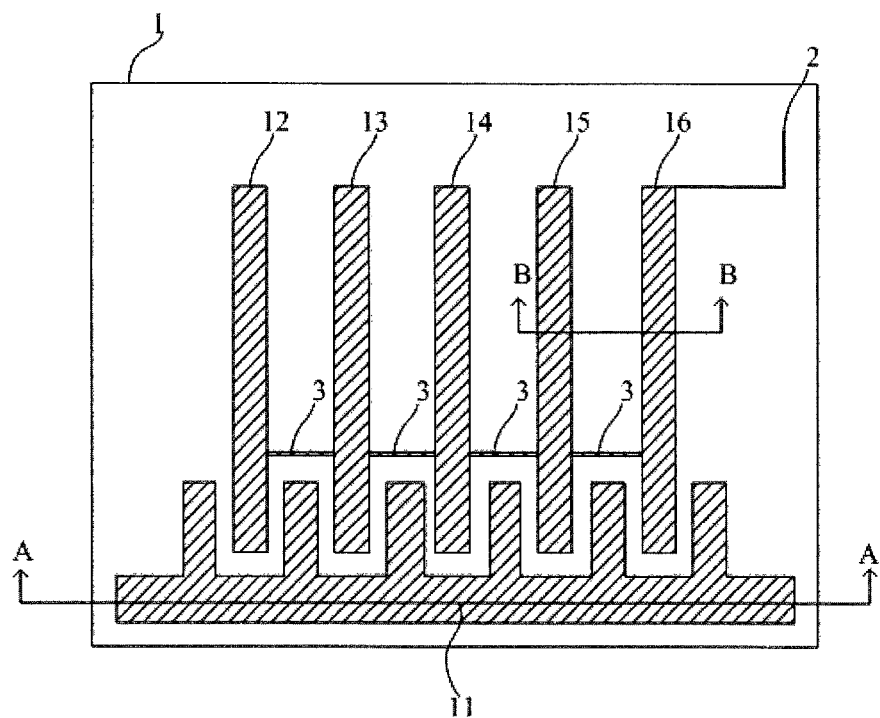
FIG. 3 is a schematic top view of a mask in accordance with a second embodiment of the present invention.

As an example, in order to more quickly disperse the electrostatic charges on the mask or completely eliminate the electrostatic charges on the mask, the second embodiment of the present invention provides a mask, as shown in FIG. 3. Besides the structures of the mask as provided in the first embodiment of the present invention, the mask further includes a grounding bus 2 provided on the mask, which is connected with the respective connecting wires 3. Of course, the grounding bus 2 may be connected with a part of the connecting wires 3. Once the charges are accumulated on the mask, the charges on the light shielding layers which are connected with the grounding bus 2 can be released away quickly through the grounding bus 2.

Specifically, a line width of the grounding wire 2 is in a range of 0.3~1.5 μm. Preferably, the line width of the grounding wire 2 is in a range of 0.5~1 μm. More preferably, the line width of the grounding wire 2 is 0.8 μm. The line width of the grounding wire 2 is narrow enough that the exposing machine cannot recognize it and thus it would not be formed on the target substrate.

It is preferred that the grounding wire 2 can be located at an area adjacent to edges of the mask.

In any mask as provided by the above embodiments of the present invention, the substrate can be glass substrate.

Apart from having the structures in the mask as described in the second embodiment of the present invention, the mask in accordance with the third embodiment of the present invention further includes:

an anti-diffraction layer, located at a light exiting side of the substrate, arranged on the respective light shielding layers and having a refractive index larger than 1. The anti-diffraction layer on the light shielding layers has the same pattern as that of the preset mask pattern corresponding to the light shielding layers. The light shielding layers and the anti-diffraction layer are laminated together.

Figure 4:
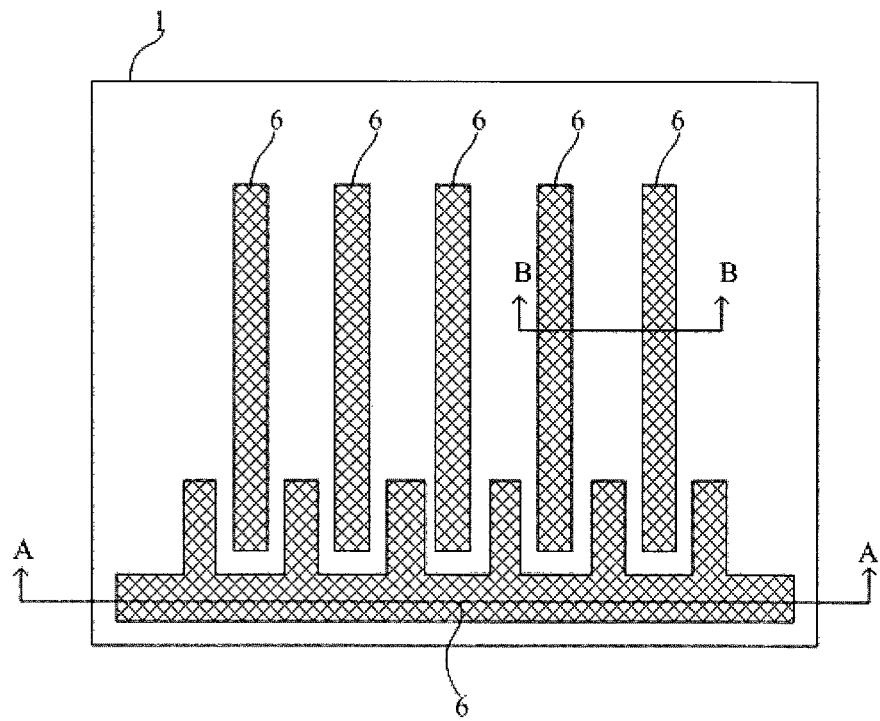
FIG. 4 is a schematic top view of a mask in accordance with a third embodiment of the present invention, with an anti-diffraction layer.

With reference to FIG. 4, it is a schematic top view showing the anti-diffraction layer 6 provided on the respective light shielding layers on the mask, wherein for sake of clarity, the connecting wires 3 and the grounding bus 2 are not shown herein.

Figure 5:
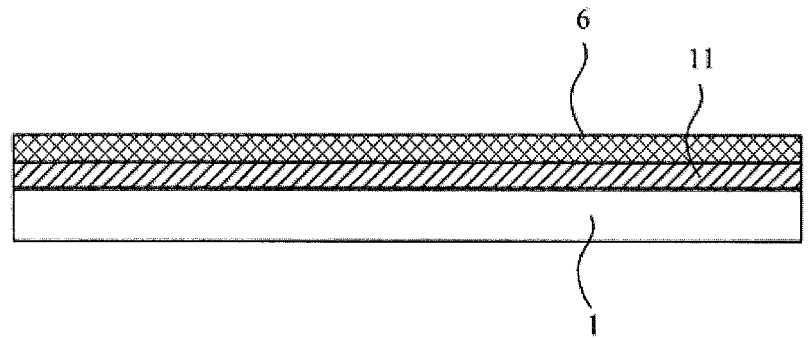
FIG. 5 is a sectional view along a A-A direction of the mask as shown in FIG. 4.

With reference to FIG. 5, it is a sectional view along a line A-A of the mask as shown in FIG. 4. It can be known that since the structures as shown in FIGS. 3-4 are substantially identical with each other, apart from FIG. 3 without the anti-diffraction layer 6, the sectional view along a line A-A of FIG. 3 is not shown herein. As shown herein, it can be seen that the mask further includes: an anti-diffraction layer 6 located at a light exiting side of the substrate 1, arranged on the light shielding layer 11 and having a refractive index larger than 1. The pattern of the anti-diffraction layer 6 is identical with the preset mask pattern, and both of them are laminated.

Providing the anti-diffraction layer 6 on the light exiting side of the mask can reduce or avoid diffraction of the light rays, so that the mask pattern on the mask can be more accurately formed onto the target substrate, thereby preventing the pattern formed on the target substrate larger than the mask pattern on the mask.

Next, taking a sectional view along a line B-B on the mask of FIG. 4 as one example, the principle of the mask as shown in FIG. 4 to prevent diffraction is illustrated below.

Figure 6:
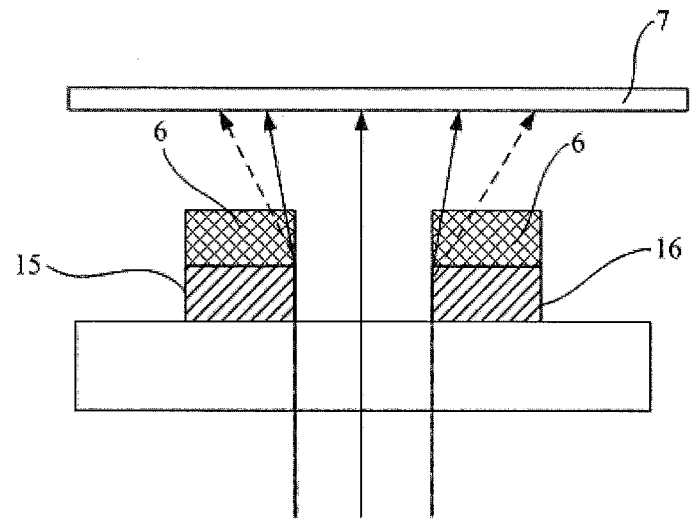
FIG. 6 is a sectional view along a B-B direction of the mask as shown in FIG. 4.

With reference to FIG. 6, it is a schematic sectional view along a line B-B of the mask as shown in FIG. 4 with the target substrate 7 to be exposed.

Arrow lines in FIG. 6 indicate the light rays, wherein dash lines indicate a schematic view of light rays propagating path upon exposing the mask without the anti-diffraction layer 6, and solid lines indicate a schematic view of light rays propagating path upon exposing the mask with the anti-diffraction layer 6.

It can be known from FIG. 6 that light rays are incident onto the target substrate 7 through the mask via a light entering side. Because the anti-diffraction layer 6 has a refractive index more than that of air (i.e., approximately 1), the light rays shift toward a silt direction between the light shielding layer 15 and the light shielding layer 16, when they are transmitted in the anti-diffraction layer 6. The pattern formed on the target substrate 7 with the anti-diffraction layer 6 is more closely to the practical size of the mask pattern on the mask than the formed pattern without the anti-diffraction layer 6.

Preferably, the anti-diffraction layer 6 is formed of a chromic oxide layer.

The mask provided by the respective embodiments of the present invention further includes: a buffer layer located between the light shielding layer and the substrate, and at least at areas corresponding to the light shielding layers. Preferably, the buffer layer is a chromium nitride layer. The chromium nitride layer can improve the adhesive force between the chromium metal layer and the substrate. The chromium nitride layer has a relatively high transmittance for the light rays, approximately above 95%, without affecting the transmittance of the light rays in exposure. Therefore, the chromium nitride layer can be a whole layer formed on the substrate, without any patterning process.

Concerning the above, the masks provided by the embodiments of the present invention overcome the problem of the electrostatic release of the mask structure designed in the prior art. Specifically, the existing mask has such structure that the ESD will be generated during the cleaning of the mask. In the prior art, even if the operator wears the anti electrostatic ring to prevent the electrostatic breakdown, it also cannot completely eliminate the ESD phenomenon on the mask, with human and materials resources consumed. The use of the deionized wind gun does not fully ensure the removal of the electrostatic charges. Once the mask is locally or completely broken-down, the mask is disregarded or needs to be repaired. If the breakdown point of the mask is not found in time, after going into production, it would cause defect of the mass product, even the product scrap.

The embodiments of the present invention utilize the characteristic that the most advanced exposing machine only has the resolution not less than 3.0 μm in the related industry. In the mask design, in the manufacturing process of the mask, at least the areas of the light shielding layers where it is easy to occur the ESD, are effectively connected together (the width of the connecting wire is below 1.5 μm, about 1.2 μm). Because the best resolution of the exposing machine is also above 3.0 μm, the pattern of the connecting wire for preventing ESD on the mask would not be patterned on the product. In this way, the electrostatic charges generated on the glass substrate of the mask are evenly conducted to the metal chromium wires, thereby forming an isopotential field. Thus, it completely and effectively avoids the occurring of the ESD on the mask.

In the respective embodiments of the present invention, the connecting wire is provided onto the substrate of the mask, for electrically connecting at least two light shielding layers on the substrate. The connecting wire has a width of 0.3~1.5 μm. The connecting wires electrically connect the light shielding layers separated from each other. The electrically connected two or more light shielding layers become one isopotential body. When there is the static electricity around the isopotential body, the isopotential body has a larger surface area of the light shielding layer than each independent light shielding layer before being connected. Thus, the electrostatic charges can be evenly distributed on the isopotential body, thereby eliminating the phenomena of electrostatic breakdown due to no release of the charges on the light shielding layers having a comparatively smaller surface area in a short time. Meanwhile, the connecting wire has a width d in a range of 0.3~1.5 μm. When exposing the target substrate with such mask, the exposing machine has a resolution f larger than 3 μm. When the conductive wire on the mask has a width $d<f/2$, it can fully ensure that the exposing machine cannot recognize it. Therefore, such connecting wires on the substrate cannot be recognized by the exposing machine, and the pattern of the connecting wires would not be formed on the target substrate, without any influence to the pattern to be formed on the target substrate. That is, in embodiments of the present invention, it is possible to solve the problem of damaging the mask pattern of the mask due to the electrostatic breakdown caused by the electrostatic release on the mask, without affecting the pattern formed on the target substrate after exposure.

Although several exemplary embodiments have been shown and described, the present invention is not limited to those and it would be appreciated by those skilled in the art that various changes or modifications may be made in these embodiments without departing from the principles and spirit of the disclosure, the scope of these changes or modifications will also fall within the scope of the present invention. The scope of the present invention is defined in the claims and their equivalents.

What is claimed is:

1. A mask, comprising:
    a substrate;
    a light transmission area on the substrate;
    a light shielding area on the substrate, provided with at least three light shielding layers, each of the at least two light shielding layers having a preset mask pattern and being conductive,
    wherein the at least three light shielding layers at least comprise a first light shielding layer and other light shielding layers except the first light shielding layer, the first light shielding layer being in a comb-like form, each of the other light shielding layers being in a strip-like form, the other light shielding layers being spaced apart by comb-like parts of the first light shielding layer; and
    one or more connecting wires, configured to at least electrically connect the at least three light shielding layers, respectively.

2. The mask according to claim 1, wherein the connecting wire has a width in a range of 0.3~1.5 µm.

3. The mask according to claim 2, wherein the connecting wire has a width in a range of 0.5~1µm.

4. The mask according to claim 3, wherein the connecting wire has a width of 0.8 µm.

5. The mask according to claim 1, wherein the connecting wire is located into the same layer as the light shielding layers are located and is made of the same material as those of the light shielding layers.

6. The mask according to claim 5, wherein the light shielding layers and the connecting wire are made of a chromium metal layer.

7. The mask according to claim 1, wherein the mask further comprises a grounding bus provided on the mask.

8. The mask according to claim 7, wherein the respective connecting wires are at least partly connected with the grounding bus.

9. The mask according to claim 7, wherein the grounding bus has a width in a range of 0.3~1.5µm.

10. The mask according to claim 1, wherein the mask further comprises an anti-diffraction layer, located at a light exiting side of the substrate, provided on the respective light shielding layers and having a refractive index greater than 1.

11. The mask according to claim 10, wherein a pattern of the anti-diffraction layer on the light shielding layers is identical with the preset mask pattern corresponding to the light shielding layers, and wherein the light shielding layers are laminated with the anti-diffraction layer.

12. The mask according to claim 10, wherein the anti-diffraction layer is formed of a chromium oxide layer.

13. The mask according to claim 1, wherein the mask further comprises a buffer layer located between the light shielding layers and the substrate and located at least at areas corresponding to the light shielding layers.

14. The mask according to claim 13, wherein the buffer layer is made of a chromium nitride layer.

* * * * *